United States Patent
Carbone et al.

(10) Patent No.: US 10,921,869 B2
(45) Date of Patent: Feb. 16, 2021

(54) CHASSIS EMBEDDED HEAT PIPE

(71) Applicant: Intel Corporation, Santa Clara, CA (US)

(72) Inventors: Mark Carbone, Cupertino, CA (US); Juha Tapani Paavola, Hillsboro, OR (US); Nicholas R. Weber, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/455,323

(22) Filed: Jun. 27, 2019

(65) Prior Publication Data

US 2019/0324507 A1 Oct. 24, 2019

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1616* (2013.01); *H05K 7/20145* (2013.01); *H05K 7/20154* (2013.01); *H05K 7/20172* (2013.01); *H05K 7/20336* (2013.01); *G06F 2200/201* (2013.01)

(58) Field of Classification Search
CPC .. G06F 1/203; G06F 1/1616; G06F 2200/201; G06F 1/20; G06F 1/206; H05K 7/20145; H05K 7/20154; H05K 7/20172; H05K 7/20336; H05K 7/20809; H05K 7/20509; H05K 7/20772; H05K 7/20936; H05K 7/20254; H05K 2201/064; H05K 7/20418; H05K 7/20445; H05K 1/0203; H05K 9/0022; H01L 23/427; H01L 23/467; H01L 23/34
USPC ......... 361/679.52, 700, 679.47, 702, 679.46, 361/679.48, 679.53, 679.54, 709, 689, 361/699, 720, 752; 165/104.26, 104.33, 165/104.21, 181, 80.3; 257/E23.088, 257/E23.099
See application file for complete search history.

(56) References Cited

U.S. PATENT DOCUMENTS

| | | | |
|---|---|---|---|
| 2004/0240178 A1* | 12/2004 | Kim | H01L 23/467 361/695 |
| 2006/0146496 A1* | 7/2006 | Asfia | H05K 7/20672 361/700 |
| 2010/0139895 A1* | 6/2010 | Hwang | H01L 23/467 165/104.26 |
| 2014/0055953 A1* | 2/2014 | Fujiwara | G06F 1/203 361/695 |
| 2015/0060023 A1* | 3/2015 | Herring | F28D 15/043 165/104.26 |

(Continued)

*Primary Examiner* — Mandeep S Buttar
(74) *Attorney, Agent, or Firm* — Patent Capital Group

(57) ABSTRACT

Particular embodiments described herein provide for an electronic device that can be configured to include one or more heat sources, a heat pipe embedded in a chassis of the electronic device, where the heat pipe is thermally coupled to the one or more heat sources to collect heat from the one or more heat sources, and a thermal cooling device, where the thermal cooling device is thermally coupled to the heat pipe and can dissipate heat collected from the heat pipe using air from outside the chassis. In an example, the heat pipe is an oscillating heat pipe and has a thickness between about two (2) millimeters to about twelve (12) millimeters.

16 Claims, 8 Drawing Sheets

(56) References Cited

U.S. PATENT DOCUMENTS

2016/0295679 A1\* 10/2016 Yeini ................. H05K 5/061
2017/0164517 A1\* 6/2017 Kim ................ H05K 7/20336

\* cited by examiner

CHASSIS EMBEDDED HEAT PIPE

TECHNICAL FIELD

This disclosure relates in general to the field of computing and/or device cooling, and more particularly, to a chassis embedded heat pipe.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems, especially for thin profile devices

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
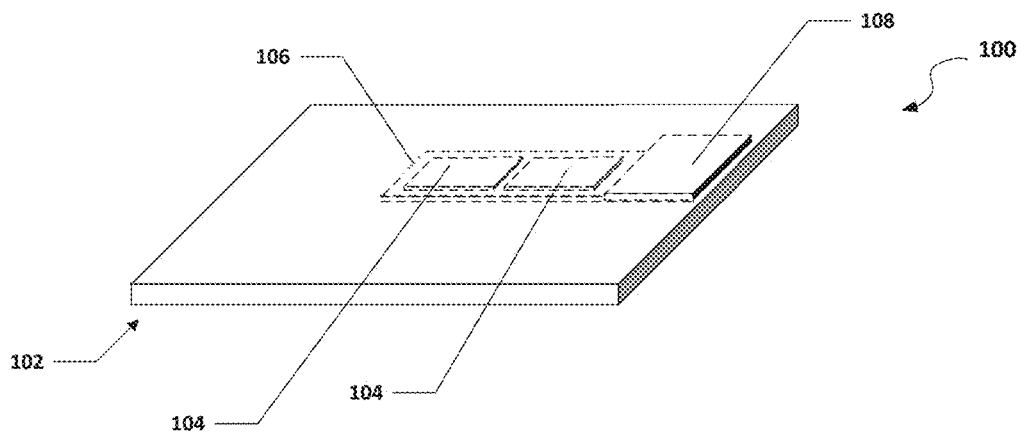
FIG. 1 is a simplified block diagram of a system to enable a chassis embedded heat pipe, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a chassis embedded heat pipe. As used herein, the term "chassis embedded heat pipe," "heat pipe embedded in a chassis," and other derivates include a heat pipe incorporated, fixed, integrated, etc. into a chassis. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration, embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents. For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. The term "coupled" may mean one or more of the following. The term "coupled" may mean that two or more elements are in direct physical, thermal, or electrical contact. However, the term "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Turning to FIG. 1, FIG. 1 is a simplified block diagram of an electronic device 100 configured with a chassis embedded heat pipe, in accordance with an embodiment of the present disclosure. In an example, electronic device 100 can include a housing 102. Housing 102 can include one or more heat sources 104, a heat pipe 106, and a thermal cooling device 108.

Housing 102 includes an exterior portion that helps protect electronic device 100 and an interior portion or cavity that defines a space that houses the components that make up electronic device 100. For example, one or more heat sources 104, heat pipe 106, and thermal cooling device 108 are located in a cavity of housing 102. Each of one or more heat sources 104 may be a heat generating device (e.g., processor, logic unit, field programmable gate array (FPGA), chip set, integrated circuit (IC), a graphics processor, graphics card, battery, memory, or some other type of heat generating device).

Heat pipe 106 may be an oscillating heat pipe, pulsating heat pipe, vapor chamber heat pipe, or some other type of heat transfer device that can be embedded and/or integrated in housing 102 and transfer heat from heat source(s) 104 to thermal cooling device 108. Heat pipe 106 can have a thickness between about two (2) millimeters (mm) to about twelve (12) mm. In other examples, heat pipe 106 can have a thickness of about 1.4 mm, about ten (10) mm, about three (3) mm to about (8) mm, or some other thickness that allows heat pipe 106 to be embedded in housing 102 and transfer heat from heat source(s) 104 to thermal cooling device 108. Thermal cooling device 108 can be configured as a thermal cooling device to help remove thermal energy from one or more heat sources. Thermal cooling device 108 may be a passive cooling device or an active cooling device to help reduce the thermal energy or temperature of one or more heat sources. In an example, thermal cooling device can draw air into housing 102 though one or more inlet vents in housing and use the air to help dissipate the heat collected by heat pipe 106.

Electronic device 100 is configured to integrate heat pipe 106 and/or one or more other thermal solution elements (e.g. fan, thermal interface material, extended heat transfer surfaces, etc.) into housing 102 of electronic device 100 to reduce system thickness, or Z-stack height, of housing 102. The term "Z stack height," "Z height," "Z location," etc. refers to the height along the "Z" axis of an (x, y, z) coordinate axis or cartesian coordinate system. Embedding heat pipe 106 into the chassis of housing 102 can provide both structural and cooling functions. In some examples, the integration of heat pipe 106 and/or one or more other thermal solution elements into housing 102 can increase the stiffness of housing 102, which can be an important requirement in relatively thin devices. The integration of heat pipe 106 and/or one or more other thermal solution elements into housing 102 can help to enable thin form factor systems that can provide a desired thermal solution for high microprocessor power, including both steady state sustained power and shorter duration higher power used to enable short duration increased computing performance through opportunistic overclocking.

Heat pipe 106 is embedded in the chassis of housing 102. In a specific example, heat pipe 106 may be an oscillating heat pipe embedded into the base of a laptop. In some examples, a main printed circuit board (PCB) of electronic device 100 can be secured to the inside of housing 102 with fasteners and oriented so the power dissipating components press against heat pipe 106 embedded in housing 102. Heat pipe 106 can be configured to extend beyond the edge of the PCB to thermal cooling device 108. In a specific example, thermal cooling device 108 can include fins that are secured to a portion of heat pipe 106 and a fan can be used to collect air from outside housing 102 and force the air through the fins to help remove the heat from heat source(s) 104 that has been collected by heat pipe 106 and transferred to the fins. The fins may be directly coupled to heat pipe 106.

A common wall thickness for an aluminum base chassis is 0.8 mm. For a typical power laptop, the area of the chassis that includes heat pipe 106 may need to be about 0.8 mm to about 2.7 mm thicker in addition to the current common wall thickness. In an example, the area of the chassis that does not include heat pipe 106 can be about 0.8 mm thick and the area that includes heat pipe 106 can be about 1.6 mm to about 3.5 mm thick. In another example, the area of the chassis that does not include heat pipe 106 can be about 0.8 mm thick and the area that includes heat pipe 106 can be about 1.6 mm to about 2.0 mm thick. The thickness of the area that includes heat pipe 106 depends on the thickness of heat pipe 106, the type of heat pipe used, the amount of heat that needs to be transferred away from heat source(s) 104, design constraints, and other factors that will be apparent to one skilled in the art.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems, especially for thin profile form factor devices.

For example, in some devices, it can be difficult to cool one or more heat sources, especially when the heat sources are located inside a relatively crowded housing that includes memory, processors, battery, etc. The relatively crowded housing can make it difficult to locate thermal solutions inside the crowded housing. Traditional passive cooling systems have separate thermal solution elements above the heat sources. The common thermal hardware in forced-air cooled laptops is a heat pipe with an attached cold plate on top of a heat source and fins that create an air-cooled heat sink.

Because even curved heat pipes must generally stay in one plane, the "Z" location (thickness dimension) of the heat sink is dictated by the height of the top of the package of the heat source being cooled. As a result, the fin height often must be limited and/or the system design may require a thicker laptop to accommodate the heat sink, especially if the heat sink includes fins. In addition, as microprocessor power increases, the heat pipe assembly must become larger and thicker to accommodate the heat generated from the microprocessor and the larger and thicker heat pipe consumes more volume in the laptop. This can require thicker laptops, which is undesirable from a user perspective. In addition, even a rather thick cold plate may not have enough thermal capacitance to enable sufficient duration of high power operation for opportunistic overclocking. What is needed is a chassis embedded heat pipe.

A system to enable a chassis embedded heat pipe, as outlined in FIG. 1, can resolve these issues (and others). In an example, a heat pipe (e.g., heat pipe 106) can be integrated into the base (e.g., interior chassis body 110 illustrated in FIG. 2) of a housing (e.g., housing 102) to sink or collect heat from one or more heat sources, a microprocessor, or other heat generating components (e.g. heat source 104). The heat pipe can extend from the heat source to a thermal cooling device (e.g., thermal cooling device 108 or a heat dissipator in thermal cooling device 108) to help dissipate the heat collected from the heat source. In an example, the thermal cooling device can include a heat dissipator such as a heat sink or fins cooled with forced air from outside the housing. In a specific example, the airflow of the forced air can be from outside of the electronic device that includes the chassis embedded heat pipe, in through inlet vents, through a fan and the fins, and then out through exhaust vents. This can allow the electronic device to handle the same power as some current heat pipe systems but in a thinner form factor, handle higher power in the same thickness as some current systems, and/or enable higher short duration increases in computing performance through opportunistic overclocking and/or longer opportunistic overclocking duration for increased computing performance.

In an example of a current traditional system Z-stack where the chassis wall is about 0.8 mm, the current traditional vapor chamber bottom wall is about 0.5 mm, the current traditional vapor channels are about 0.5 mm, and the current traditional vapor chamber top wall is about 0.5 mm, the total Z-stack height of the chassis wall and heat pipe of the current traditional system is about 2.3 mm. By embedding or integrating the heat pipe into the chassis, the total Z-stack height can be about 1.6 mm. More specifically, the bottom wall of the integrated chassis may be about 0.6 mm, the vapor channels may be about 0.5 mm, and the top wall of the integrated chassis may be about 0.5 mm, bringing the total Z-stack height to about 1.6 mm. The total wall thickness in the heat pipe area is about two (2) mm. This is thinner than the hardware it replaces (chassis wall plus cold plate plus heat pipe thickness) and this reduces the Z-stack over the heat source. In some examples, the total wall thickness in the heat pipe area may be 3.5 mm.

Use of the embedded heat pipe can help to relieve design issues related to the mechanical design stack-up over a heat exchanger. In a traditional heat pipe system, the fins are mounted to the heat pipe, and the heat pipe position in the Z direction is dictated by the location of the top of the microprocessor package. In some current heat pipe systems, the fins may be kept shorter than desired in an attempt to reduce the Z-height thickness of the computer base. With a chassis embedded heat pipe, the fins are mounted to the heat pipe (which is embedded in the chassis) so the fins can be as tall as the interior cavity of the housing. Some systems require two or more heat pipes and there is a void between heat pipes where heat must be spread laterally by a cold plate. The chassis embedded heat pipe can fully cover the heat input area in electronic device 100 (e.g., fully cover the area of all the die on a microprocessor package in electronic device 100) and there is no need for a cold plate to spread heat over the voids between heat pipes.

In some examples of a chassis embedded heat pipe, the total chassis wall thickness may double from about 0.8 mm to about 1.6 mm. The increase in chassis wall thickness can provide an increase in the stiffness in the chassis. At the same time the total thickness of the system, or Z-stack heights, may be reduced (in some examples up to about thirty percent (30%)). In addition, a weight reduction may also be realized. A stiffer chassis wall can help to increase the overall stiffness of electronic device 100, but it will give better protection for electronic components inside of electronic device 100 against mechanical impacts, may enable higher package load, and may enable the use of a grease based thermal interface material rather than a gap pad. In addition, the thermal performance may also be improved because of the increased material (mass) between the heat source and thermal insulators.

In some examples, the length of the channels of heat pipe 106 can be relatively short and therefore heat pipe 106 may be relatively thin (approximately two (2) mm), especially if heat pipe 106 is an oscillating heat pipe. More specifically, the relatively small area of heat pipe 106 can help minimize the length of liquid channels in heat pipe 106 and enable the channels to be relatively narrow/thin. The relatively narrow/thin channels can help enable a relatively thin overall heat pipe 106 and a relatively thin housing 102. In other examples, in order to accommodate a processor with unusually high power and therefore increased thermal energy, heat pipe 106 and housing 102 can be made thicker (e.g., approximately 2.5 mm housing Z-height for an oscillating heat pipe). The increased thickness of housing 102 and heat pipe 106 can accommodate relatively longer channels, especially for an oscillating heat pipe. In addition, both the heat input and output areas of heat pipe 106 can be relatively large. However, one limitation for such a design may be in providing sufficiently high airflow to remove heat from the system without exceeding a maximum allowable exhaust air temperature.

In an example, thermal cooling device 108 may be a 2-phase heat spreader, embedded into the wall of housing 102 and cooled by forced convection air that enters and exits housing 102 through vents. If thermal cooling device 108 includes fins, the fin base area on heat pipe 106 can be relatively larger than what is on a standard current heat pipe. This can enable a higher fin count, longer fins, and flexibility in fin spacing (e.g., fin spacing can be increased to reduce air pressure drop). The fins can be essentially as tall as the interior cavity of housing 102 which can help to reduce design constraints in the area of thermal cooling device 108.

Some current systems include a 2-phase heat spreader in the wall of a sealed enclosure. However, those systems do not include drawing air from outside the enclosure and passing the air through the enclosure for cooling. The current systems do not include a system where air is drawn into an enclosure through vents, over fins that are coupled to a heat pipe embedded and/or integrated into the enclosure, and then blown back out of the enclosure.

In an example implementation, electronic device 100, is meant to encompass a computer, a personal digital assistant (PDA), a laptop or electronic notebook, a cellular telephone, an iPhone, a tablet, an IP phone, network elements, network appliances, servers, routers, switches, gateways, bridges, load balancers, processors, modules, or any other device, component, element, or object that includes a heat source. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic devices 100 can include memory elements for storing information to be used in operations. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, heat source 104 may be or include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
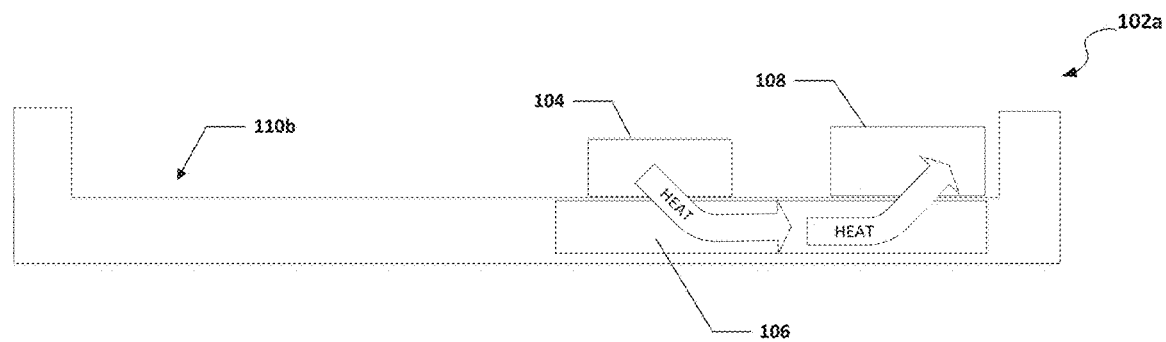
FIG. 2 is a simplified block diagram of a partial view of a system to enable a chassis embedded heat pipe, in accordance with an embodiment of the present disclosure.

Turning to FIG. 2, FIG. 2 is a simplified block diagram of a cut-away side view of a housing 102a. Housing 102a can include one or more heat sources 104, heat pipe 106, and thermal cooling device 108. Housing 102a can have an interior chassis body 110a that includes heat pipe 106. As illustrated in FIG. 2, heat can be transferred from heat source 104 to heat pipe 106. Heat pipe 106 can transfer the heat away from heat source 104 and to thermal cooling device 108 where the heat can be dissipated. In an example, the thickness of interior chassis body 110a may be between about 1.6 mm and about 2.0 mm. In another example, the thickness of interior chassis body 110 be about 1.6 mm to about 3.5 mm thick.

Figure 3:
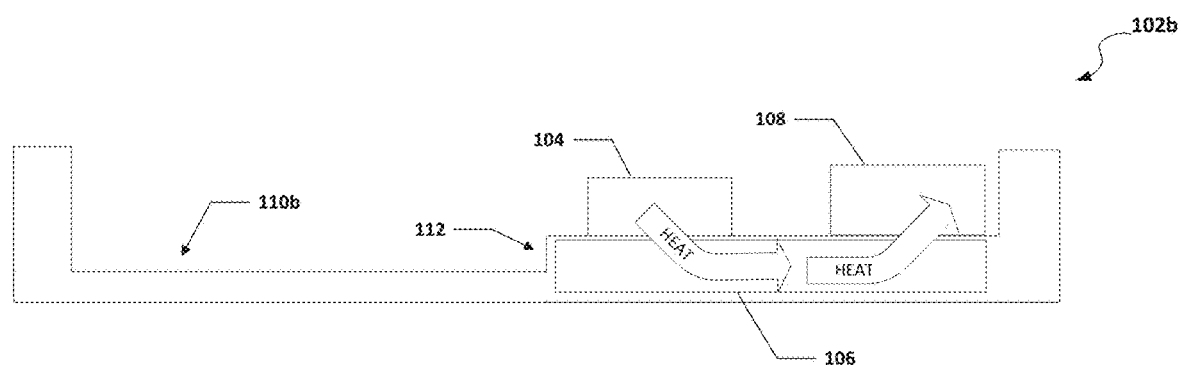
FIG. 3 is a simplified block diagram of a partial view of a system to enable a chassis embedded heat pipe, in accordance with an embodiment of the present disclosure.

Turning to FIG. 3, FIG. 3 is a simplified block diagram of a cut-away side view of a housing 102b. Housing 102b can include one or more heat sources 104, heat pipe 106, and thermal cooling device 108. Housing 102b can have an interior chassis body 110b and a raised inner surface portion 112. Raised inner surface portion 112 can include heat pipe 106. As illustrated in FIG. 3, heat can be transferred from heat source 104 to heat pipe 106. Heat pipe 106 can transfer the heat away from heat source 104 and to thermal cooling device 108 where the heat can be dissipated. In an example, the thickness of interior chassis body 110b may be about 0.8 mm in thickness. The thickness of raised inner surface portion 112 may be between about 1.6 mm to about 2.0 mm. In another example, the thickness of interior chassis body 110b can be about 0.8 mm thick and the thickness of raised inner surface portion 112 can be about 1.6 mm to about 3.5 mm thick.

Figure 4A:
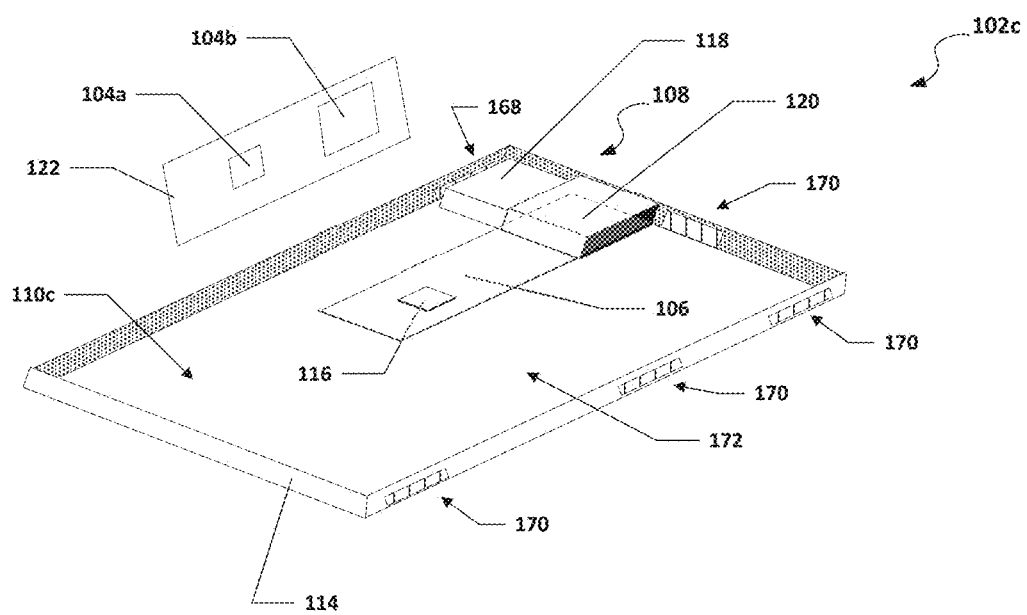
FIG. 4A is a simplified block diagram of a partial perspective view of a system to enable a chassis embedded heat pipe, in accordance with an embodiment of the present disclosure.

Turning to FIG. 4A, FIG. 4A is a simplified block diagram of a portion of a housing 102c. In an example, housing 102c can include an interior chassis body 110c and walls 114. Walls 114 can include one or more inlet vents 168 and one or more exhaust vents 170. Walls 114 can extend from interior chassis body 110c and define a chassis cavity 172 that includes heat pipe 106 and thermal cooling device 108. Heat pipe 106 can include a pedestal 116. Pedestal 116 can be used to accommodate heat sources of different heights. Thermal cooling device 108 can include an air mover 118 and a heat dissipator 120. Heat dissipator 120 may be a heat sink and can include a plurality of fins. Air mover 118 can be configured to draw in air from one or more inlet vents 168 and force the air over and/or through heat dissipator 120. Heat dissipator 120 can be configured to collect heat from heat pipe 106 and transfer the heat to the environment through one or more exhaust vents 170. In an example, heat dissipator 120 may be fins. In some examples, the height of heat dissipator 120 can extend from interior chassis body 110c to the height or almost the height of walls 114 or at least a majority of the height of walls 114. In a specific example, heat dissipator 120 may be fins and the fins extend from heat pipe 106 to at least a majority of the height of walls 114.

One or more heat sources may be located on a PCB 122. In some examples, one or more heat sources may have a different height than other heat sources. For example, as illustrated in FIG. 4A, heat source 104a may be shorter in height than heat source 104b. Because heat source 104a may be shorter in height than heat source 104b, heat pipe 106 can include pedestal 116 to couple with heat source 104a when PCB is positioned over heat pipe 106.

Figure 4B:
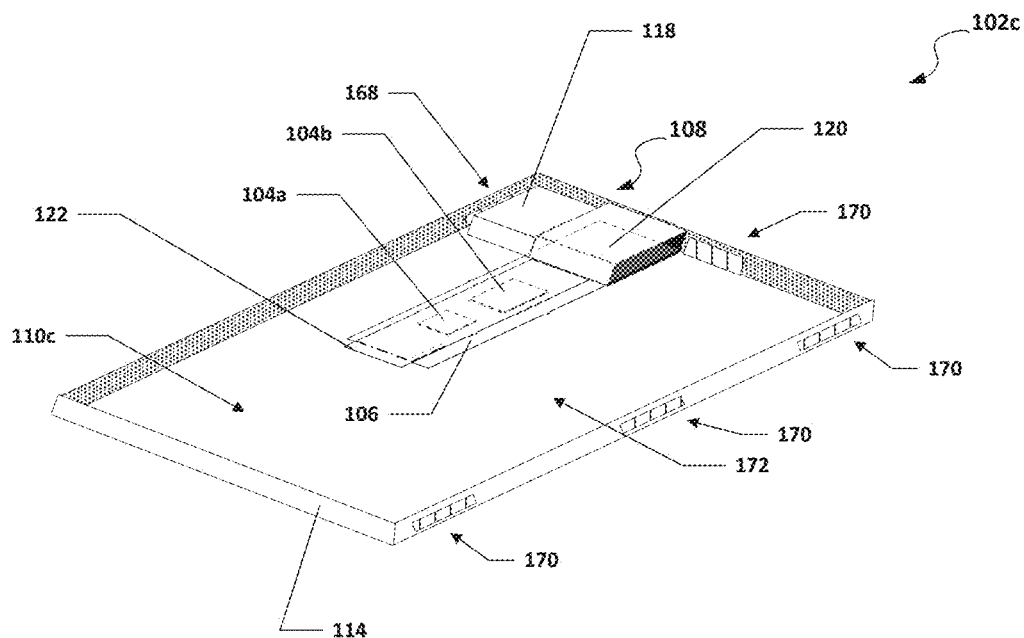
FIG. 4B is a simplified block diagram of a partial perspective view of a system to enable a chassis embedded heat pipe, in accordance with an embodiment of the present disclosure

Turning to FIG. 4B, FIG. 4B is a simplified block diagram of a portion of a housing 102c. In an example, PCB 122 can be positioned over heat pipe 106 and secured to interior chassis body 110c to coupled heat sources 104a and 104b to heat pipe 106. Pedestal 116 (not shown) can help to couple heat source 104a to heat pipe 106. Heat can be transferred from heat sources 104a and 104b to heat pipe 106. Heat pipe 106 can transfer the heat away from heat sources 104a and 104b and to heat dissipator 120. Air mover 118 can be configured to draw in air from one or more inlet vents 168 and force the air over and/or through heat dissipator 120, where the heat collected by heat dissipator 120 from heat pipe 106 can be dissipated through one or more exhaust vents 170.

Figure 5:
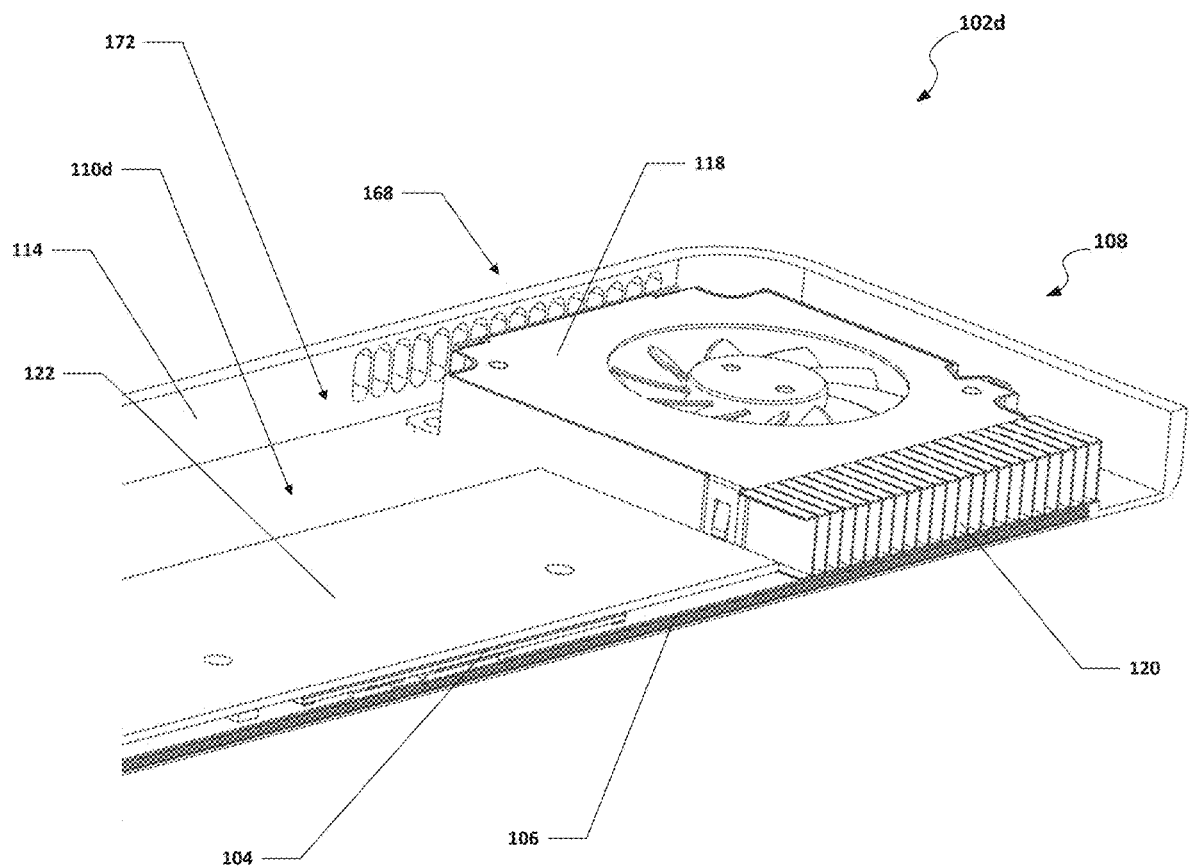
FIG. 5 is a simplified block diagram of a partial perspective view of a system to enable a chassis embedded heat pipe, in accordance with an embodiment of the present disclosure.

Turning to FIG. 5, FIG. 5 is a simplified cut-away block diagram of a portion of a housing 102d. Housing 102d can include interior chassis body 110d and walls 114. Walls 114 can define chassis cavity 172. In an example, a portion of wall 114 that is proximate to air mover 118 can include one or more inlet vents 168 to allow for the flow of air into air mover 118. Housing 102d can include one or more heat sources 104, heat pipe 106, and thermal cooling device 108. One skilled in the art would recognize that the location of one or more heat sources 104, heat pipe 106, and/or thermal cooling device 108 illustrated in FIGS. 2-5 are for illustration purposes only and other configurations or orientations are possible. For example, one or more heat sources 104, heat pipe 106, and/or thermal cooling device 108 may be located in other areas in the housing, heat pipe 106 and thermal cooling device 108 may be parallel to one or more heat sources 104, etc.

Figure 6A:
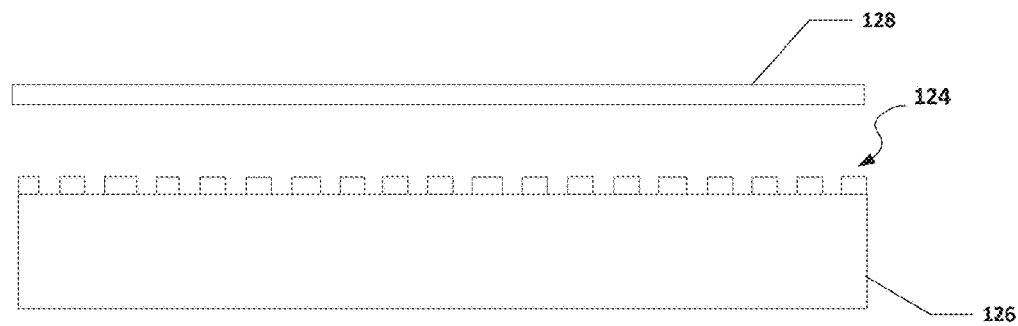
FIG. 6A is a simplified block diagram of a partial view of a system to enable a chassis embedded heat pipe, in accordance with an embodiment of the present disclosure.
Figure 6B:
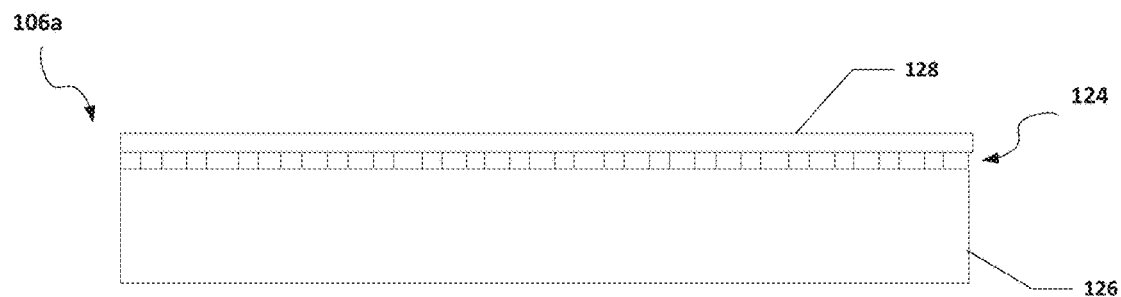
FIG. 6B is a simplified block diagram of a partial view of a system to enable a chassis embedded heat pipe, in accordance with an embodiment of the present disclosure

Turning to FIGS. 6A and 6B, FIGS. 6A and 6B are a simplified block diagram illustrating the formation of a heat pipe embedded in a chassis of an electronic device. Grooved vapor channels 124 can be created in a chassis 126 of an electronic device. Chassis 126 may be a milled or extruded aluminum chassis. After grooved vapor channels 124 are created in chassis 126, a vapor chamber lid 128 can be soldered above grooved vapor channels 124, to create a heat pipe 106a as illustrated in FIG. 6B. Grooved vapor channels 124 can house vapor liquid and the process may be implemented in a vacuum space. Vapor chamber lid 128 may be a copper material or some other thermally conductive material that can help transfer heat from heat source 104 to heat pipe 106a and from heat pipe 106a to thermal cooling device 108.

Figure 7:
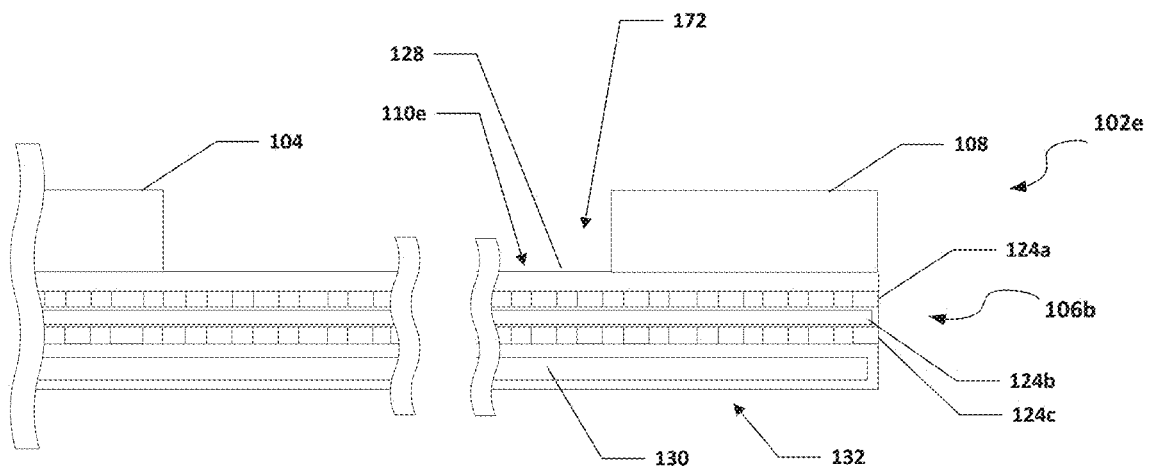
FIG. 7 is a simplified block diagram of a partial view of a system to enable a chassis embedded heat pipe, in accordance with an embodiment of the present disclosure.

Turning to FIG. 7, FIG. 7 is a simplified block diagram of a portion of a housing 102e. Housing 102e can include one or more heat sources 104, heat pipe 106b, thermal cooling device 108, interior chassis body 110e, an insulation layer 130, and chassis cavity 172. Heat pipe 106b can include one or more grooved vapor channels. For example, as illustrated in FIG. 7, heat pipe 106b includes a first grooved vapor channel 124a, a second grooved vapor channel 124b, and a third grooved vapor channel 124c. Each of the grooved vapor channels may be perpendicular to each other. For example, grooved vapor channel 124b may be under and perpendicular to grooved vapor channel 124a. Insulation layer 130 may be a vacuum gap or some other type of insulation integrated into interior chassis body 110e that can insulate the heat collected by heat pipe 106b from an outer surface 132 of housing 102e. In some examples, insulation layer 130 may have polished walls to reduce radiation heat transfer and/or can include one or more stiffening structures to reinforce chassis 126 and help prevent deflection.

Figure 8:
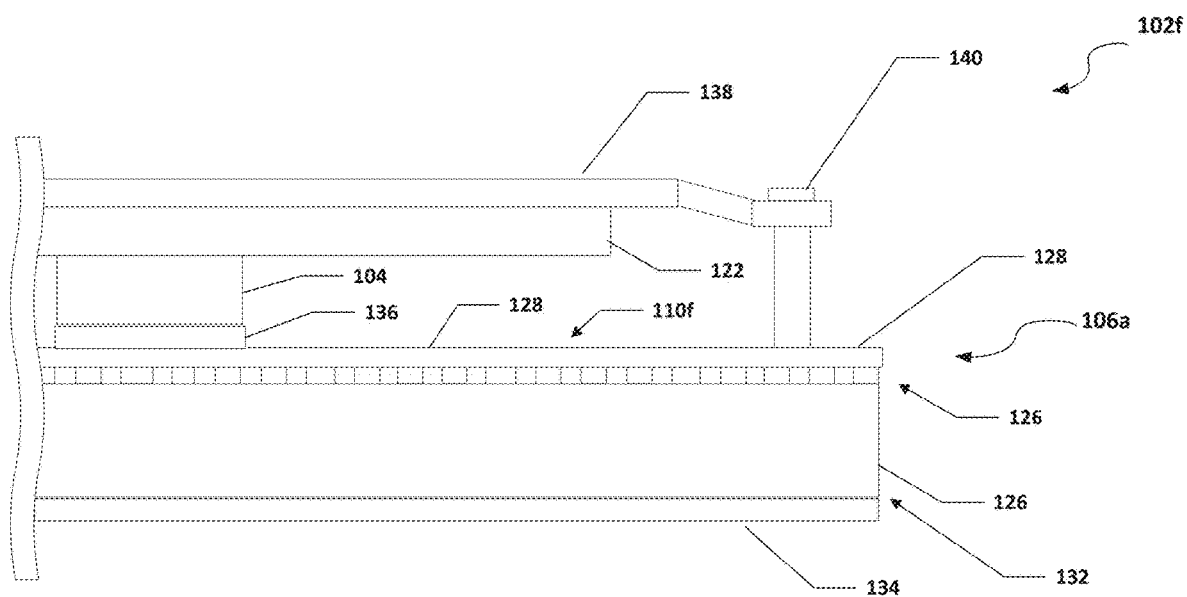
FIG. 8 is a simplified block diagram of a partial view of a system to enable a chassis embedded heat pipe, in accordance with an embodiment of the present disclosure.

Turning to FIG. 8, FIG. 8 is a simplified block diagram of a portion of a housing 102f. Housing 102f can include one or more heat sources 104, heat pipe 106a, thermal cooling device 108, interior chassis body 110f, PCB 122, an external insulation layer 134, a thermal interface material (TIM) layer 136, a backplate 138, and a backplate securing means 140. External insulation layer 134 may be under outer surface 132 of housing 102f and can help insulate a user or surface from the heat collected by heat pipe 106b that reaches outer surface 132. TIM layer 136 can help to provide a thermal coupling between heat source 104 and vapor chamber lid 128. Backplate 138 and backplate securing means 140 can be configured to create a force on PCB 122 and heat source 104 in the direction of heat pipe 106a to help with the transfer of heat from heat source 104 to heat pipe 106a.

Figure 9:
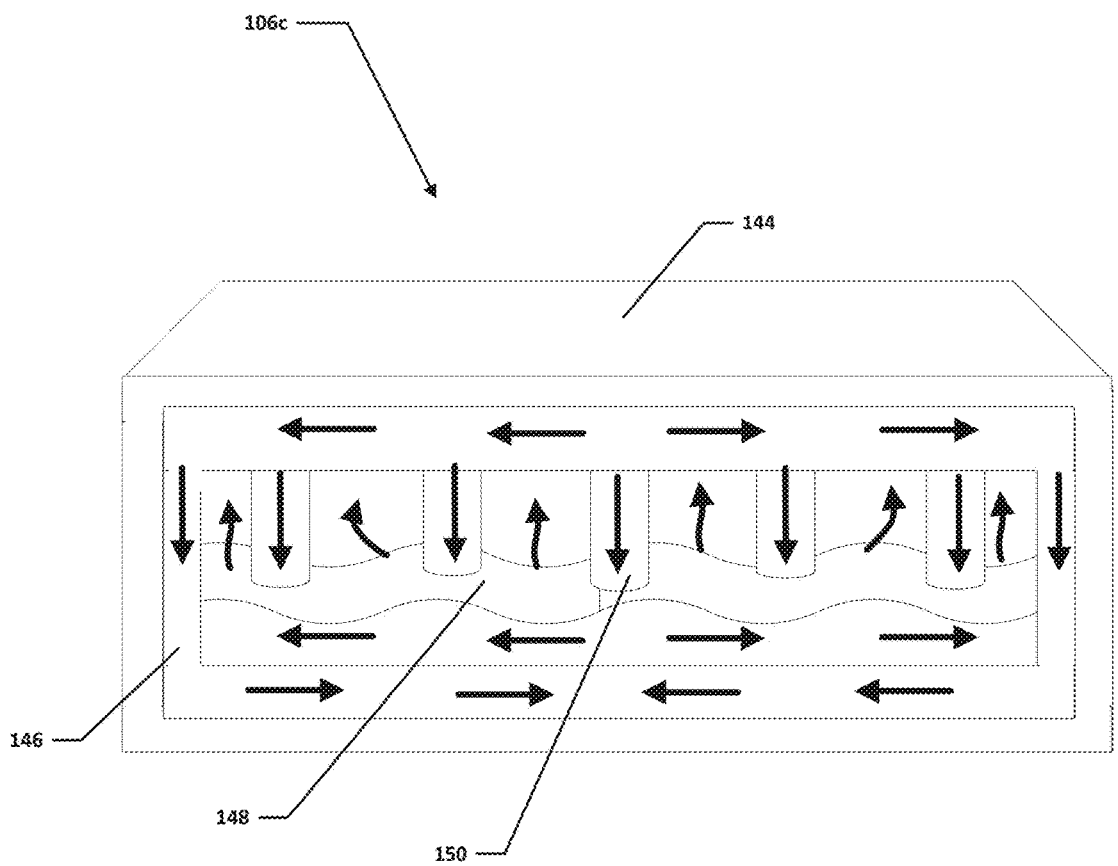
FIG. 9 is a simplified block diagram of a partial view of a system to enable a chassis embedded heat pipe, in accordance with an embodiment of the present disclosure.

Turning to FIG. 9, FIG. 9 is a simplified block diagram of an example of a heat pipe 106c. Heat pipe 106c may be a vapor chamber. In an illustrative example, heat pipe 106c can combine the principles of thermal conductivity and phase transition to transfer heat between two solid interfaces such as a heat source and a thermal cooling device. Heat pipe 106c can include an outer wall 144 that contains an interior heat chamber 146 and a liquid 148 in a hermetically sealed environment. Liquid 148 can be water. Support posts 150 can help provide structural support to heat pipe 106c.

In an example, at a hot interface of heat pipe 106c (e.g., the area where outer wall 144 is proximate to a heat source) liquid 148 turns into a vapor by absorbing heat from outer wall 144. The vapor then travels along interior heat chamber 146 to a cold interface (e.g., thermal cooling device 108) and condenses back into liquid 148 and releases heat to the cold interface. Liquid 148 then returns to the hot interface through capillary action, centrifugal force, gravity, etc. and the cycle repeats.

Figure 10:
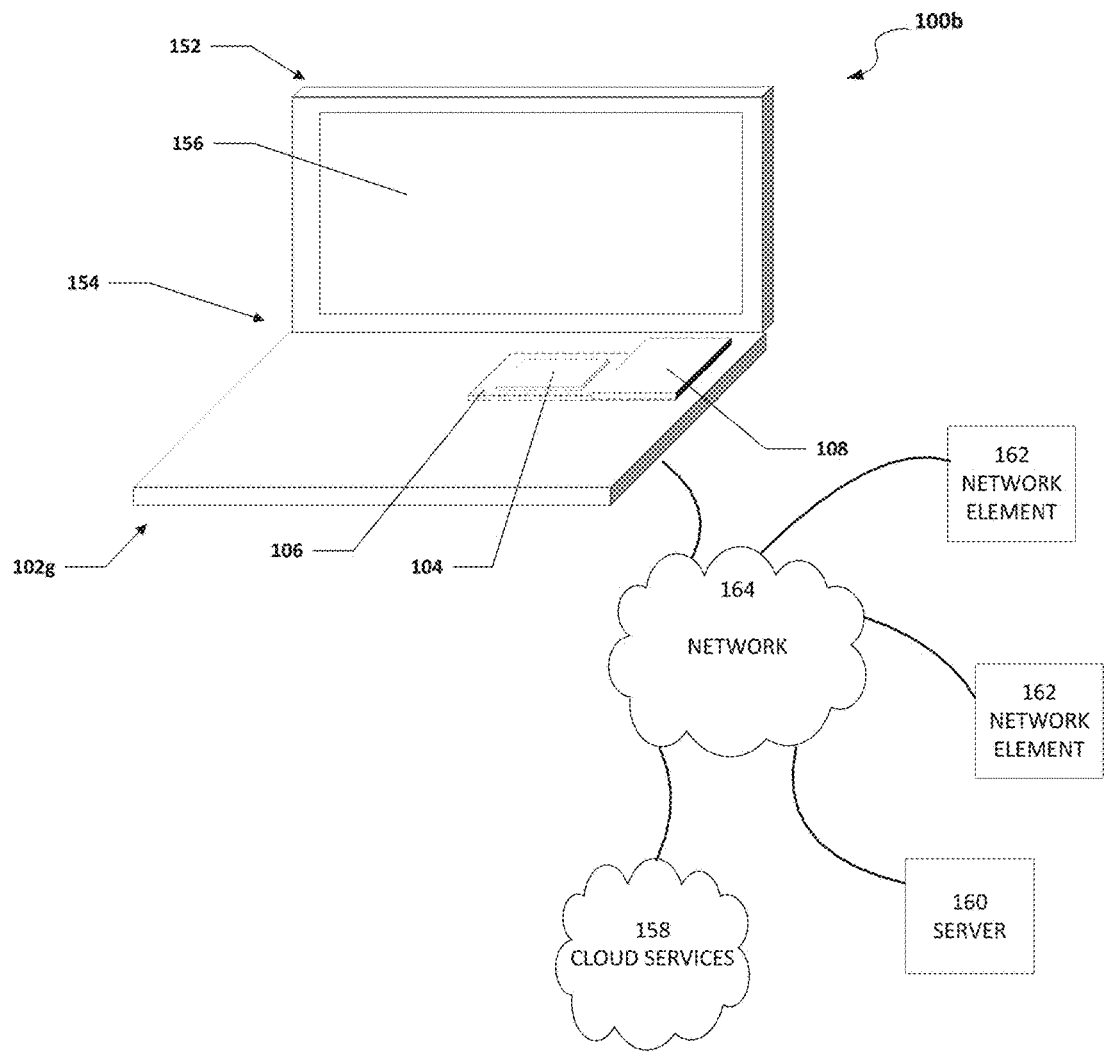
FIG. 10 is a simplified block diagram of a system to enable a chassis embedded heat pipe, in accordance with an embodiment of the present disclosure.

Turning to FIG. 10, FIG. 10 is a simplified block diagram of a portion of an electronic device 100b. Electronic device 100b may be a clamshell computer and can include a first housing 102g and a second housing 152. First housing 102g can be rotationally coupled to second housing 152 using a hinge 154. First housing 102g can include one or more heat sources 104, heat pipe 106, and a thermal cooling device 108. Second housing 152 can include a display 156. Electronic device 100b may be in communication with cloud services 158, one or more servers 160, and/or one or more network elements 162 using network 164. In some examples, electronic device 100g may be standalone devices and not connected to network 164 or another device.

Elements of FIG. 10 may be coupled to one another through one or more interfaces employing any suitable connections (wired or wireless), which provide viable pathways for network (e.g., network 164, etc.) communications. Additionally, any one or more of these elements of FIG. 10 may be combined or removed from the architecture based on particular configuration needs. Network 164 may include a configuration capable of transmission control protocol/Internet protocol (TCP/IP) communications for the transmission or reception of packets in a network. Electronic devices 100b may also operate in conjunction with a user datagram protocol/IP (UDP/IP) or any other suitable protocol where appropriate and based on particular needs.

Turning to the infrastructure of FIG. 10, network 164 represents a series of points or nodes of interconnected communication paths for receiving and transmitting packets of information. Network 164 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 164, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although heat pipe 106 been illustrated with reference to particular elements and operations, these elements and operations may be replaced by any suitable architecture, protocols, and/or processes that achieve the intended functionality of heat pipes 106.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device can include one or more heat sources, a heat pipe embedded in a chassis of the electronic device, where the heat pipe is thermally coupled to the one or more heat sources, and a thermal cooling device, where the thermal cooling device is thermally coupled to the heat pipe and can dissipate heat collected from the heat pipe.

In Example A2, the subject matter of Example A1 can optionally include where the heat pipe is an oscillating heat pipe.

In Example A3, the subject matter of any one of Examples A1-A2 can optionally include where the heat pipe has a thickness between about two (2) millimeters to about twelve (12) millimeters.

In Example A4, the subject matter of any one of Examples A1-A3 can optionally include where a portion of the chassis that does not include the heat pipe has a first thickness of about 0.8 millimeters and a portion of the chassis where the heat pipe is embedded has a second thickness of about 1.6 millimeters to about 3.5 millimeters.

In Example A5, the subject matter of any one of Examples A1-A4 can optionally include a second heat pipe embedded in the chassis, wherein the second heat pipe is under and perpendicular to the heat pipe.

In Example A6, the subject matter of any one of Examples A1-A5 can optionally include where the thermal cooling device includes a fan and a heat dissipator.

In Example A7, the subject matter of any one of Examples A1-A6 can optionally include where the heat dissipator includes fins that are directly coupled to the heat pipe.

In Example A8, the subject matter of any one of Examples A1-A7 can optionally include an insulation layer under the heat pipe to insulate an outer surface of the chassis from heat in the heat pipe.

In Example A9, the subject matter of any one of Examples A1-A8 can optionally include a first heat source, wherein the first heat source has a first height, a second heat source, where the second heat source has a second height that is shorter than the first height, and a pedestal on the heat pipe to accommodate a height difference between the first heat source and the second heat source Example AA1 is a chassis including one or more inlet vents to allow air from outside the chassis to flow into the chassis, a heat pipe embedded in the chassis, and a plurality of walls, wherein the plurality of walls define a chassis cavity. The chassis cavity can include one or more heat sources, wherein the heat pipe is thermally coupled to the one or more heat sources to collect heat from the one or more heat sources and a thermal cooling device, wherein the thermal cooling device is thermally coupled to the heat pipe and can dissipate heat collected from the heat pipe using air from outside the chassis that passed into the chassis through the one or more inlet vents.

In Example AA2, the subject matter of Example AA1 can optionally include where the heat pipe is an oscillating heat pipe.

In Example AA3, the subject matter of any one of the Examples AA1-AA2 can optionally include where the heat pipe has a thickness between about two (2) millimeters to about twelve (12) millimeters.

In Example AA4, the subject matter of any one of the Examples AA1-AA3 can optionally include where a portion of the chassis that does not include the heat pipe has a thickness of about 0.8 millimeters and a portion of the chassis where the heat pipe is embedded has a thickness of about 1.8 millimeters to about two (2) millimeters.

In Example AA5, the subject matter of any one of the Examples AA1-AA4 can optionally include where the thermal cooling device includes a fan and a heat dissipator.

In Example AA6, the subject matter of any one of the Examples AA1-AA5 can optionally include where the thermal cooling device includes fins that are directly coupled to the heat pipe.

In Example AA7, the subject matter of any one of the Examples AA1-AA6 can optionally include where the chassis is part of a clamshell computer.

Example M1 is a method including embedding a heat pipe in a chassis of a housing, coupling one or more heat sources to the heat pipe, wherein the heat pipe is thermally coupled to the one or more heat sources to collect heat from the one or more heat sources, and coupling a thermal cooling device to the heat pipe, wherein the thermal cooling device is thermally coupled to the heat pipe and can dissipate heat collected from the heat pipe using air from outside the chassis.

In Example M2, the subject matter of Example M1 can optionally include where the heat pipe is an oscillating heat pipe.

In Example M3, the subject matter of any one of the Examples M1-M2 can optionally include where the heat pipe has a thickness between about two (2) millimeters to about twelve (12) millimeters.

In Example M4, the subject matter of any one of the Examples M1-M3 can optionally include where a portion of the chassis that does not include the heat pipe has a thickness of about 0.8 millimeters and a portion of the chassis where the heat pipe is embedded has a thickness of about 1.6 millimeters to about 3.5 millimeters.

Example AA1 is an apparatus including means for embedding a heat pipe in a chassis of a housing, means for coupling one or more heat sources to the heat pipe, wherein the heat pipe is thermally coupled to the one or more heat sources to collect heat from the one or more heat sources, and means for coupling a thermal cooling device to the heat pipe, wherein the thermal cooling device is thermally coupled to the heat pipe and can dissipate heat collected from the heat pipe using air from outside the chassis.

In Example AA2, the subject matter of Example AA1 can optionally include where the heat pipe is an oscillating heat pipe.

In Example AA3, the subject matter of any one of Examples AA1-AA2 can optionally include where the heat pipe has a thickness between about two (2) millimeters to about twelve (12) millimeters.

In Example AA4, the subject matter of any one of Examples AA1-AA3 can optionally include where a portion of the chassis that does not include the heat pipe has a thickness of about 0.8 millimeters and a portion of the chassis where the heat pipe is embedded has a thickness of about 1.6 millimeters to about 3.5 millimeters.

What is claimed is:

1. An electronic device comprising:
   one or more heat sources;
   a heat pipe embedded in a chassis of the electronic device, wherein the heat pipe is an oscillating heat pipe with a thickness between about two (2) millimeters to about twelve (12) millimeters and is thermally coupled to the one or more heat sources, wherein the heat pipe comprises a plurality of vapor groove channels integrated into the chassis and a vapor chamber lid secured above the plurality of vapor groove channels to form the heat pipe; and
   a thermal cooling device, wherein the thermal cooling device includes a fan and a heat dissipator and the heat dissipator includes fins that are directly coupled to the heat pipe and can dissipate heat collected from the heat pipe.

2. The electronic device of claim 1, wherein a portion of the chassis that does not include the heat pipe has a first thickness of about 0.8 millimeters and a portion of the chassis where the heat pipe is embedded has a second thickness of about 1.6 millimeters to about 3.5 millimeters.

3. The electronic device of claim 1, further comprising:
   a second heat pipe embedded in the chassis, wherein the second heat pipe is under and perpendicular to the heat pipe.

4. The electronic device of claim 1, further comprising:
   an insulation layer under the heat pipe to insulate an outer surface of the chassis from heat in the heat pipe.

5. The electronic device of claim 1, wherein the one or more heat sources includes:
   a first heat source with a first height; and
   a second heat source, with a second height that is shorter than the first height, wherein the electronic device further comprises:
   a pedestal on the heat pipe to accommodate a height difference between the first heat source and the second heat source.

6. The electronic device of claim 1, further comprising:
   a vacuum gap between the heat pipe and an outer surface of the chassis of the electronic device.

7. A chassis comprising:
   one or more inlet vents to allow air from outside the chassis to flow into the chassis;
   a heat pipe embedded in the chassis, wherein the heat pipe comprises a plurality of vapor groove channels integrated into the chassis and a vapor chamber lid secured above the plurality of vapor groove channels to form the heat pipe; and
   a plurality of walls, wherein the plurality of walls define a chassis cavity, wherein the chassis cavity includes:
   one or more heat sources, wherein the heat pipe has a thickness between about two (2) millimeters to about twelve (12) millimeters and is thermally coupled to the one or more heat sources to collect heat from the one or more heat sources; and
   a thermal cooling device, wherein the thermal cooling device includes a fan and a heat dissipator and the heat dissipator includes fins that are directly coupled to the heat pipe and can dissipate heat collected from the heat pipe using air from outside the chassis that passed into the chassis through the one or more inlet vents.

8. The chassis of claim 7, wherein the heat pipe is an oscillating heat pipe.

9. The chassis of claim 7, wherein a portion of the chassis that does not include the heat pipe has a thickness of about 0.8 millimeters and a portion of the chassis where the heat pipe is embedded has a thickness of about 1.8 millimeters to about two (2) millimeters.

10. The chassis of claim 7, wherein the chassis is part of a clamshell computer.

11. A method comprising:
    creating grooved vapor channels in a chassis of a housing of an electronic device;
    securing a vapor chamber lid over the grooved vapor channels to create a heat pipe in the chassis of the housing of the electronic device;
    coupling one or more heat sources to the heat pipe, wherein the heat pipe is thermally coupled to the one or more heat sources to collect heat from the one or more heat sources; and
    coupling a thermal cooling device to the heat pipe, wherein the thermal cooling device includes a fan and a heat dissipator and the heat dissipator includes fins that are directly coupled to the heat pipe and can dissipate heat collected from the heat pipe using air from outside the chassis.

12. The method of claim 11, wherein the heat pipe is an oscillating heat pipe.

13. The method of claim 11, wherein the heat pipe has a thickness between about two (2) millimeters to about twelve (12) millimeters.

14. The method of claim 11, wherein a portion of the chassis that does not include the heat pipe has a thickness of about 0.8 millimeters and a portion of the chassis where the heat pipe is embedded has a thickness of about 1.6 millimeters to about 3.5 millimeters.

15. The method of claim 11, wherein the heat pipe includes a second grooved vapor chamber that has second grooved vapor channels that are perpendicular to the grooved vapor channels.

16. The method of claim 15, wherein the heat pipe includes a third grooved vapor chamber that has third grooved vapor channels that are perpendicular to the second grooved vapor channels in second grooved vapor chamber.

* * * * *